United States Patent
Tsui et al.

(10) Patent No.: US 6,313,516 B1
(45) Date of Patent: Nov. 6, 2001

(54) METHOD FOR MAKING HIGH-SHEET-RESISTANCE POLYSILICON RESISTORS FOR INTEGRATED CIRCUITS

(75) Inventors: Yu-Ming Tsui; Wen-Cheng Chang, both of Hsin-Chu; Shung-Jen Yu, Yung-Ho, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/524,523

(22) Filed: Mar. 13, 2000

Related U.S. Application Data

(62) Division of application No. 09/332,426, filed on Jun. 14, 1999.

(51) Int. Cl.[7] .................................................. H01L 29/00
(52) U.S. Cl. ........................ 257/538; 257/533; 257/536; 257/532
(58) Field of Search ..................................... 438/237, 238, 438/382–4; 257/532, 533, 536, 538

(56) References Cited

U.S. PATENT DOCUMENTS

| | | | |
|---|---|---|---|
| 5,530,418 | 6/1996 | Hsu et al. ............................. 338/307 |
| 5,728,598 | 3/1998 | Wu et al. ................................ 437/60 |
| 5,728,615 | * 3/1998 | Cheng et al. ......................... 438/238 |
| 5,837,592 | 11/1998 | Chang et al. ......................... 438/382 |
| 5,840,607 | * 11/1998 | Yeh et al. ............................. 438/257 |
| 6,204,105 | * 3/2001 | Jung .................................... 438/238 |

* cited by examiner

*Primary Examiner*—Charles Bowers
*Assistant Examiner*—William M. Brewster
(74) *Attorney, Agent, or Firm*—George O. Saile; Stephen B. Ackerman

(57) ABSTRACT

A high-sheet-resistance polysilicon resistor for integrated circuits is achieved by using a two-layer polysilicon process. After forming FET gate electrodes and capacitor bottom electrodes from a polycide layer, a thin interpolysilicon oxide (IPO) layer is deposited to form the capacitor inter-electrode dielectric. A doped polysilicon layer and an undoped polysilicon layer are deposited and patterned to form the resistor. The doped polysilicon layer is in-situ doped to minimize the temperature and voltage coefficients of resistivity. Since the undoped polysilicon layer has a very high resistance (infinite), the resistance is predominantly determined by the doped polysilicon layer. The doped polysilicon layer can be reduced in thickness (less than 1000 Angstroms) to further increase the sheet resistance for mixed-mode circuits, while the undoped polysilicon layer allows contact openings to be etched in an insulating layer over the resistor without overetching the thin doped polysilicon layer and damaging the underlying IPO layer.

5 Claims, 2 Drawing Sheets

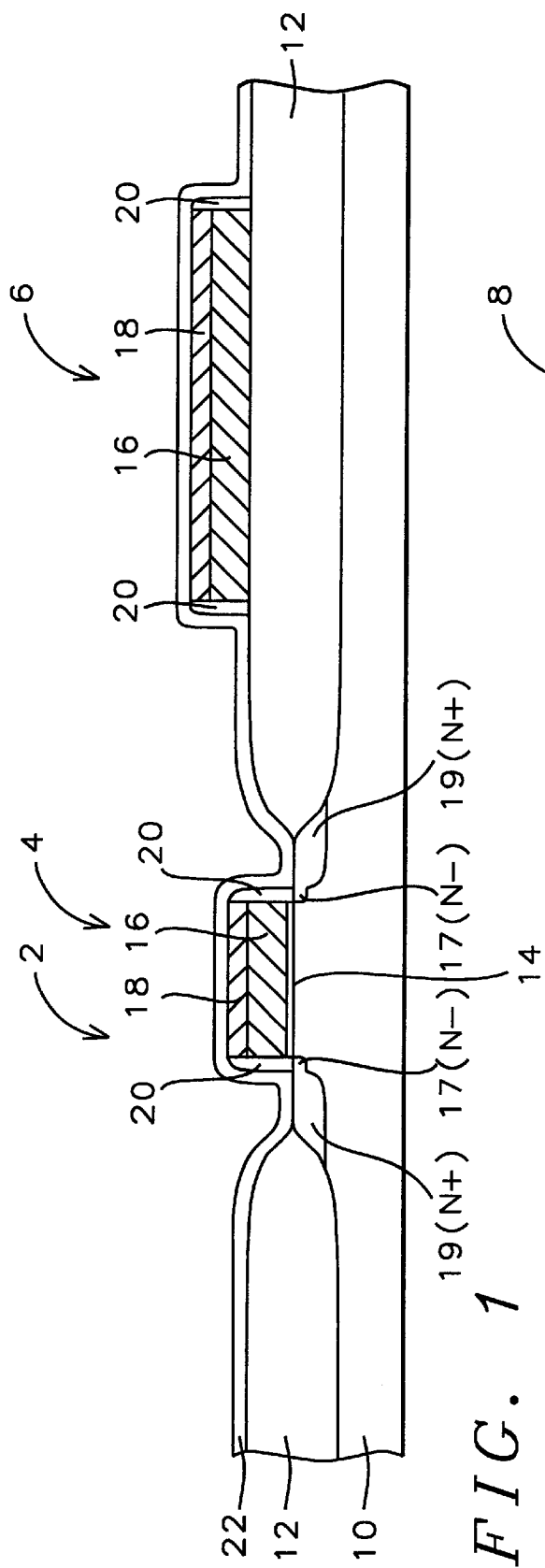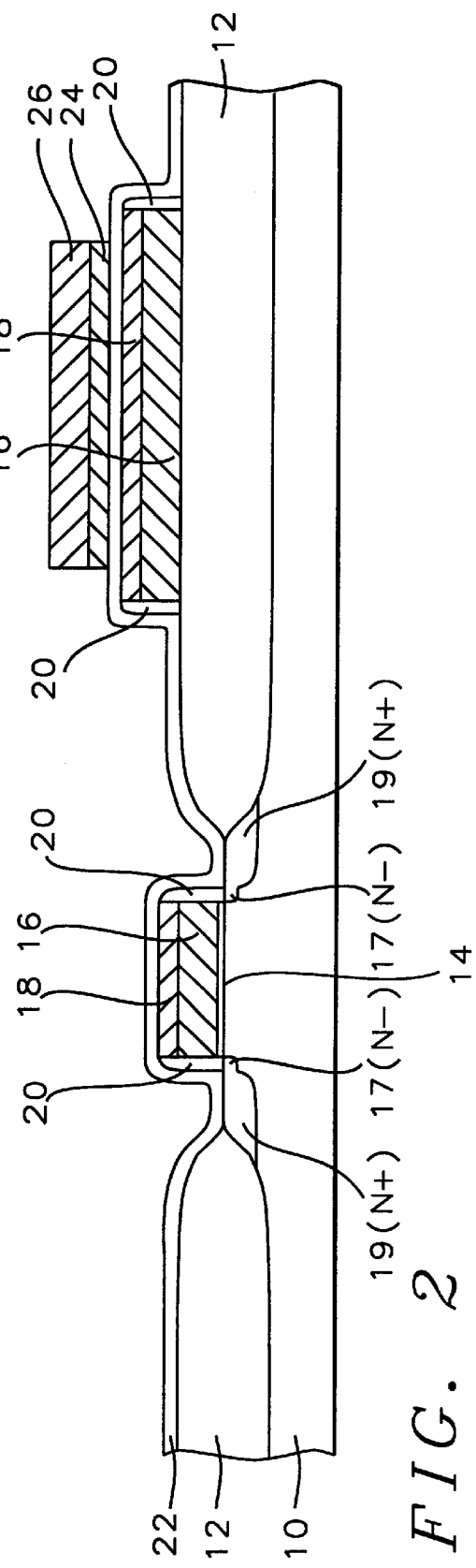

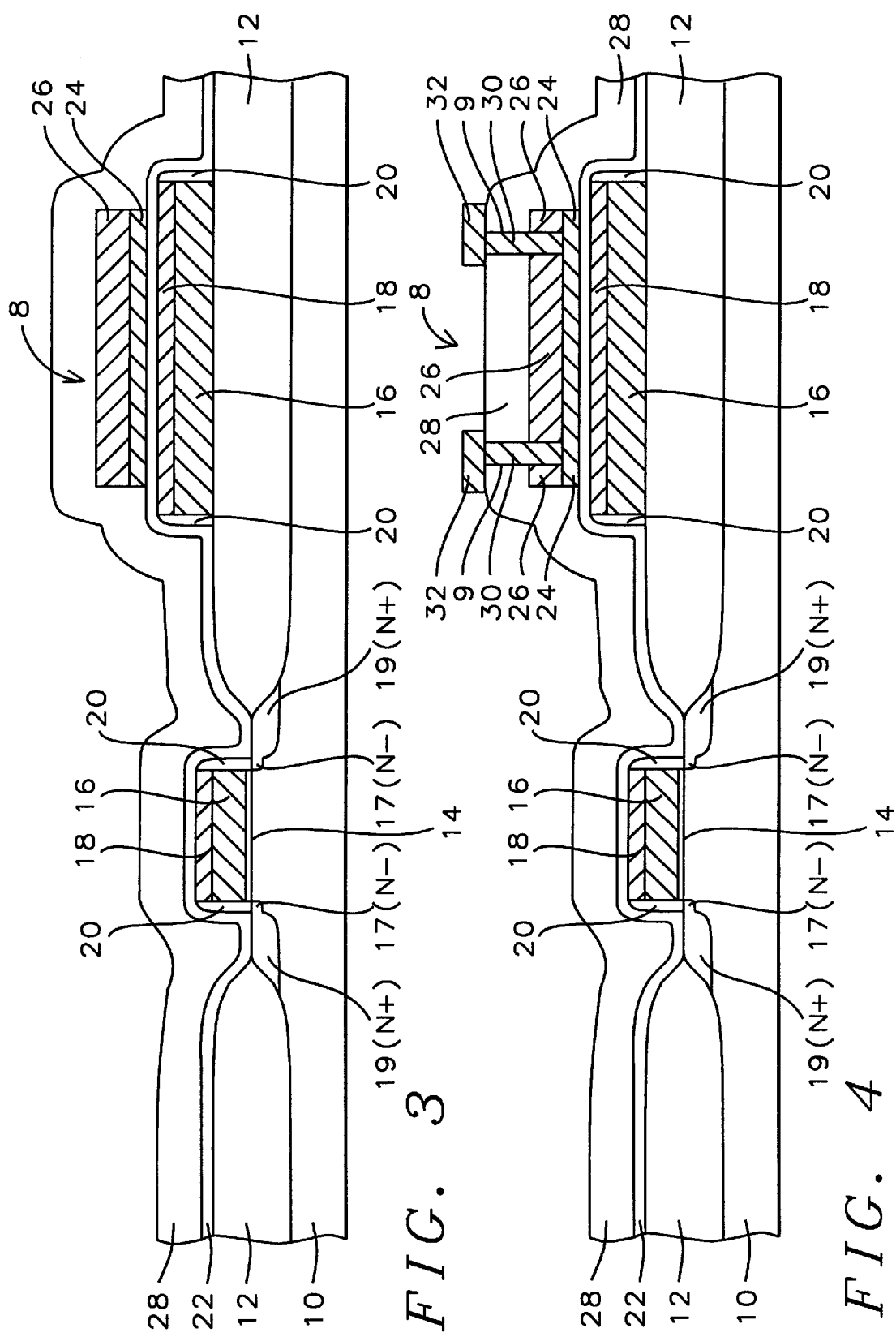

METHOD FOR MAKING HIGH-SHEET-RESISTANCE POLYSILICON RESISTORS FOR INTEGRATED CIRCUITS

This is a division of patent application Ser. No. 09/332, 426, filing date Jun. 14, 1999, A Method For Making High-Sheet-Resistance Polysilicon Resistors For Integrated Circuits, assigned to the same assignee as the present invention.

BACKGROUND OF THE INVENTION (1) Field of the Invention

The present invention relates to the fabrication of high-resistance polysilicon resistors for integrated circuits on semiconductor substrates, and more particularly relates to a two-layer polysilicon resistor structure that can have any desirable sheet resistance and have more reliable contacts than conventional polysilicon resistors.

(2) Description of the Prior Art

Many integrated circuits utilize both analog and digital circuits on the same chip, commonly referred to as mixed-mode circuits. Besides analog-to-digital converters (ADC) and digital-to-analog converters (DAC), some special applications circuits include audio Digital-Sign-Processing (DSP) circuits, battery chargers and the like. These mixed-mode circuits require capacitors and resistors having high resistance. These high value resistors are fabricated by patterning a doped polysilicon layer having high sheet resistivity $R_S$ that is expressed by the equation $$R_S = rho/T$$

where rho is the resistivity expressed in units of ohm-cm, and T is the thickness of the doped polysilicon expressed in cm. To achieve a high $R_S$, it is therefore necessary to either increase the resistivity, rho, or to decrease the thickness, T. One method of doping the polysilicon layer is by $POCl_3$ doping, but the high resistivity values are difficult to control. Another method of achieving high sheet resistance $R_S$ is to use ion implantation, which more accurately controls the dopant level in the polysilicon layer. However, implanted resistors generally have greater variations in resistance as a function of temperature and voltage, typically expressed by the temperature coefficient of resistivity (TCR), and by the voltage coefficient of resistivity (VCR), respectively. Another method of increasing the resistance $R_S$ is to reduce the thickness T of the doped polysilicon layer. However, when the thickness of the polysilicon layer is reduced to less than 1000 Angstroms to increase the resistivity, contacts etched in an insulating layer over and to this thin polysilicon layer can result in overetching. Overetching of this thin polysilicon layer can damage the thin underlying interpolysilicon oxide (IPO) layer when the resistors are formed over the IPO layer, which also serves as the interelectrode dielectric for capacitors.

Several methods for making polysilicon resistors which are stable from hydrogen intrusion have been reported. For example, Hsu et al., U.S. Pat. No. 5,530,418, teach a method of forming a metal shield around a polysilicon resistor to prevent hydrogen intrusion. Another method for stabilizing polysilicon resistors from hydrogen intrusion is described by Chang et al. in U.S. Pat. No. 5,837,592, in which the polysilicon resistors are treated in a nitrogen plasma, which minimizes variations of the resistance due to hydrogen intrusion. Also, a method for making Static Random Access Memory (SRAM) with low stand-by currents is described by Wu et al., U.S. Pat. No. 5,728,598, in which the voltage on one polysilicon layer induces a depletion region in a second polysilicon layer that results in a higher sheet resistance.

However, there is still a need in the semi-conductor industry to provide polysilicon resistors having repeatable high resistance for mixed-mode circuit applications.

SUMMARY OF THE INVENTION

A principal object of this invention is to fabricate a resistor having high-value resistance that can be varied over a wide range of resistance values for use in analog/digital circuit applications.

It is another object of this invention to form these high-value resistors using two layers: a thin doped polysilicon layer for providing high sheet resistance, and an undoped polysilicon layer on the doped polysilicon layer for etching reliable contacts without destroying a thinner capacitor oxide under the doped polysilicon layer.

Still another objective of this invention is to integrate these resistors into the semiconductor process to provide a very manufacturable process.

In accordance with the objects of the invention, a method for fabricating improved polysilicon resistors having high sheet resistance for integrated circuits is described. The method and structure can be integrated with polycide FETs without significantly increasing processing complexity. These high-value polysilicon resistors can be formed by reducing the thickness of the doped polysilicon layer to less than 1000 Angstroms. However, when these polysilicon resistors are formed over capacitor bottom electrodes formed from the FET polycide layer, etching contact openings in an insulating layer to the thin doped polysilicon resistor can damage (overetch) the underlying thin interelectrode dielectric layer on the capacitor bottom electrodes.

The method for making these polysilicon resistors begins by providing a semiconductor substrate. Field oxide regions formed, for example by the local oxidation of silicon (LOCOS) method, surround and electrically isolate device areas for the FETs. A thin gate oxide is grown on the device areas for the FETs. A polycide layer, composed of a doped first polysilicon layer and an upper refractory metal silicide layer, is deposited and patterned to form FET gate electrodes over the device areas and to serve as local interconnections and the capacitor bottom electrodes over the field oxide-areas. Lightly doped source/drain areas are implanted in the device areas adjacent to the FET gate electrodes to minimize short-channel effects. Sidewall spacers are formed on the sidewalls of the gate electrodes, and source/drain contact areas are implanted to complete the FETs. The polysilicon resistors are now made by depositing a thin first insulating layer to form an interpolysilicon oxide (IPO) layer. This IPO layer is used as an inter-electrode dielectric layer for the capacitors, and typically is silicon oxide ($SiO_2$) and usually is very thin (100 Angstroms or less) to provide high capacitance. A second polysilicon layer is deposited and is in-situ doped with phosphorus and is used to form the high-value resistors. The second polysilicon layer is deposited by low-pressure chemical vapor deposition (LPCVD) using silane ($SiH_4$) and a dopant gas such as phosphine ($PH_3$). The flow rate of the $PH_3$ can be adjusted to achieve different resistivities. To further increase the sheet resistance ($R_S$), which is equal to the resistivity divided by the thickness of the polysilicon layer, the thickness of the polysilicon layer can be reduced. However, for mixed analog/digital circuits, which require high sheet resistance (for example 200–2000 ohms per square), the doped polysilicon layer may be thinner than 1000 Angstroms, and the contact openings etched in the insulator to this thin polysilicon layer can result in overetch that damages the thin underlying interelectrode dielectric layer. To circumvent this problem, the invention utilizes an undoped third polysilicon layer on the thin doped second polysilicon layer. The undoped third and thin doped second polysilicon layers are patterned to form resistors and concurrently to form top plates for capacitors. The resistor consists of the two layers that form parallel resistors between the contacts, but since the undoped polysilicon has a very high resistivity (essentially infinite), the resistance is determined predominantly by the thin doped second polysilicon layer. A relatively thick second insulating layer is deposited to electrically insulate the FET devices on the substrate, and include the capacitors and resistors. Contact openings for the resistors are etched in the second insulating layer and into the undoped third polysilicon layer to the doped second polysilicon layer, wherein the undoped third polysilicon layer prevents etching through the doped second polysilicon layer and overetching the thin first insulating layer on the polycide layer that is also used to form capacitor bottom electrodes. Electrically conducting plugs are formed in the contact openings. Preferably the plugs are formed by depositing a tungsten layer and chemically/mechanically polishing back to the second insulating layer. A metal layer, such as aluminum/copper (AlCu), is deposited and patterned to form the next level of interconnections, contacting the conducting plugs to complete the resistors with electrical connections.

BRIEF DESCRIPTION OF THE DRAWINGS

The objects and other advantages of the invention are best understood with reference to the embodiment and in conjunction with the following drawings.

FIGS. 1 through 4 are schematic cross-sectional view depicting the process steps for making a high-sheet-resistance polysilicon resistor by the method of this invention.

DESCRIPTION OF THE PREFERRED EMBODIMENT

In keeping with the objects of this invention, the method is described for making a two-layer polysilicon resistor having high sheet resistance that is integrated into a circuit having field effect transistors (FETs). The method is applicable to mixed-mode (analog/digital) circuits, such as audio digital signal processing (DSP) techniques, battery chargers, and other circuits such as analog-to-digital converters (ADC) and digital-to-analog converters (DAC). The method allows these two-layer polysilicon resistors to be made in part over a thin insulating layer over an underlying polycide layer. The polycide layer is patterned to make FET gate electrodes and is simultaneously patterned to form the bottom electrodes for capacitors. The thin insulating layer serves as the interdielectric layer for the capacitor. The method of this invention allows contacts to be etched to a thin polysilicon layer, which is patterned to form resistors, without etching into the thin underlying insulating layer over the capacitor bottom electrodes.

The method is described for integrating this improved resistor structure with an N-channel FET. However, it should be well understood by those skilled in the art that by using additional processing steps (masking and ion implantations), both P- and N-channel FETs can be made on N- and P-doped wells in the substrate and that the polysilicon resistor can be integrated into these structures to form complementary metal oxide semiconductor (CMOS) circuits for mixed-mode technologies (analog/digital circuits).

Referring to FIGS. 1 through 4, and to simplify the discussion, the sequence of process steps for making these improved resistors is described only for the N-channel FETs. Referring first to FIG. 1, the method for making this resistor structure begins by providing a substrate 10 having device areas 2. The preferred substrate is composed of a P-type single-crystal silicon having a <100> crystallographic orientation. A field oxide (FOX) 12 is then formed on the substrate surrounding and electrically isolating the device areas 2 in which N-channel FETs are formed. One method of forming the FOX 12 is by the LOCal Oxidation of Silicon (LOCOS) which is commonly practiced in the industry. The detailed process is not shown in FIG. 1, but consists of forming a relatively thin pad oxide as a stress release layer on the silicon substrate, followed by depositing a LPCVD silicon nitride ($Si_3N_4$) layer, which serves as an oxidation barrier mask. Openings are etched in the $Si_3N_4$ layer over the areas where the FOX 12 is desired. The silicon substrate is then subjected to a thermal oxidation to form the FOX. Typically the FOX 12 is grown to thickness of between about 2000 and 6000 Angstroms. To improve circuit density, other more advanced isolation schemes can be used to form the FOX 12, such as shallow trench isolation (STI) that is also commonly practiced in the industry. However, for the method of this invention the more commonly employed LOCOS isolation is used.

Next, a gate oxide 14 is formed on the device areas 2, for example by thermal oxidation. The $SiO_2$ gate oxide 14 is grown to a thickness of between about 40 and 200 Angstroms. Next, a polycide layer, composed of a doped first polysilicon layer 16 and an upper refractory metal silicide layer 18, is deposited. The first polysilicon layer 16 is deposited by LPCVD using $SiH_4$ as the reactant gas, and is doped with arsenic or phosphorus to provide an N type conductive dopant having a concentration of between about $1.0\ E\ 13$ and $1.0\ E\ 16$ atoms/cm$^3$. Layer 16 can be doped either by ion implantation or in situ during the polysilicon deposition. The first polysilicon layer 16 is deposited to a thickness of between about 500 and 1500 Angstroms. A refractory metal silicide layer 18 is deposited on layer 16. Layer 18 is preferably a tungsten silicide, and can be deposited by CVD using a tungsten hexafluoride and SiH4 as the reactant gases. Typically the silicide layer 18 is deposited to a thickness of between about 500 and 1500 Angstroms. The polycide layer (16 and 18) is then patterned to form FET gate electrodes 4 over the device areas 2. The polycide layer is also patterned to form local interconnections, which include capacitor bottom electrodes 6 over the FOX 12. Conventional photolithographic techniques and anisotropic plasma etching are used to pattern the polycide layer (16 and 18). The plasma etching is carried out in a high-density plasma (HDP) etcher using an etchant gas containing chlorine (Cl) or bromine (Br), which etches polysilicon selectively to the underlying $SiO_2$ (layers 14 and 12). Lightly doped source/drain areas 17(N$^-$) are formed by implanting arsenic or phosphorus in the device areas 2 adjacent to the FET gate electrodes 4 to minimize short-channel effects. Sidewall spacers 20 are formed on the sidewalls of the gate electrodes 4 by depositing a conformal insulating layer such as $SiO_2$ and/or silicon nitride, and anisotropically etching back. Next source/drain contact areas 19(N$^+$) are heavily implanted to provide good ohmic contacts to complete the FETs.

Still referring to FIG. 1, a thin first insulating layer 22 is deposited to form an interpolysilicon oxide (IPO) layer over the patterned polycide layer (16 and 18). This IPO layer is preferably $SiO_2$ and serves as an interdielectric layer for the capacitor. The IPO layer 22 is deposited by CVD to a preferred thickness of between about 200 and 800 Angstroms. Alternatively, other insulators having high dielectric constants can be used for the IPO layer 22 to increase capacitance.

Referring to FIG. 2 and more specifically to the method of this invention, the resistors with high sheet resistance are made by first depositing a doped second polysilicon layer 24 that is relatively thin. The second polysilicon layer 24 is deposited preferably by LPCVD using $SiH_4$, and is in-situ doped using a dopant gas such as phosphine ($PH_3$). The flow rate of the $PH_3$ is adjusted to vary the dopant concentration to achieve different resistivities. Since the temperature coefficient of resistance (TCR) and the voltage coefficient of resistance (VCR) are less for in-situ-doped polysilicon resistors compared to ion-implanted polysilicon resistors, the resistor values are less dependent on temperature and voltage and result in more stable resistors.

Since mixed mode (analog/digital) circuits require high value resistors, one method of increasing the resistance is to reduce the thickness T of the second polysilicon layer 24 for a given dopant concentration. This results from an increase in the sheet resistance $R_S$ (ohms/sq), which is an inverse function of the polysilicon thickness T, and is expressed by the equation $$R_S = rho/T$$

where $R_S$ is the sheet resistance per square, rho is the resistivity in ohm-cm, and T is the thickness of the doped polysilicon layer.

However, for mixed analog/digital circuits, which require high sheet resistance (for example 200–2000 ohms per square), the doped polysilicon layer 24 (doped with phosphorus to a concentration of between about $1.0 \times 10^{19}$ and $1.0 \times 10^{21}$ ions/cm$^3$) may be thinner than 1000 Angstroms (having a thickness between about 500 and 1500 Angstroms). In subsequent processing when contact openings are etched for the resistor in the insulating layer over and to this thin polysilicon layer 24, overetching can damage the thin underlying interelectrode dielectric layer 22 on the polycide layer (16 and 18) used for the capacitor bottom electrode 6.

Still referring to FIG. 2, the invention utilizes an undoped third polysilicon layer 26 on the thin doped second polysilicon layer 24 to circumvent this overetch problem. The third polysilicon layer 26 is deposited by LPCVD using silane ($SiH_4$) as the reactant gas, and is deposited to a thickness of between about 500 and 1500 Angstroms.

The undoped third polysilicon layer 26 and the thin doped second polysilicon layer 24 are patterned to form resistors having the desired sheet resistance ($R_S$), for example between about 20 and 2000 ohms/sq. The third and second polysilicon layers 26 and 24 are also patterned to form the top electrodes for the capacitors (not shown). The third and second polysilicon layers 26 and 24 are patterned using conventional photolithographic techniques and anisotropic plasma etching to form the resistors 8. The plasma etching can be carried out using, for example, high-density-plasma etching and an etchant gas mixture containing $Cl_2$ that selectively etches the polysilicon layers 26 and 24 to the underlying oxide layer 22. The resistor consists of the two patterned polysilicon layers 24 and 26 in parallel: the patterned top undoped polysilicon layer 26 has a resistance R1, and the patterned doped polysilicon layer 24 has a resistance R2. The resistance of the parallel resistors is given by $$1/R = 1/R1 + 1/R2$$

Since R1 of the patterned undoped polysilicon layer 26 is very large (infinite), then 1/R1 is essentially zero. Therefore, the resistance R of the resistor is essentially determined by the resistance of the doped layer, i.e., equal to R2.

Referring to FIG. 3, a relatively thick second insulating layer 28 is deposited to electrically insulate the discrete circuit elements on the substrate that include the FETs 4, capacitors (not shown), and resistors 8. Layer 28 is preferably $SiO_2$, deposited by LPCVD using a reactant gas such as tetraethosiloxane (TEOS). The second insulating layer 28 is deposited to a thickness of between about 5000 and 12000 Angstroms.

Referring to FIG. 4, contact openings, which include contact openings 9 to the resistors, are etched in the second insulating layer 28 and into the undoped third polysilicon layer 26 to the doped second polysilicon layer 24, wherein the undoped third polysilicon layer 26 prevents etching through the doped second polysilicon layer 24 and overetching the thin first insulating layer 22 on the polycide layer (18 and 16) that is also used for the capacitor bottom electrodes. The contact openings are etched using conventional photolithographic techniques and anisotropic plasma etching. For example, the etching can be carried out using high-density-plasma etching and an etchant gas mixture such as $CF_4$, $C_2F_6$, $CHF_3$, Ar, and $O_2$.

Still referring to FIG. 4, the contacts to the resistors are completed by forming electrically conducting plugs in the contact openings 9. The plugs are formed preferably by depositing a tungsten layer 30 sufficiently thick to fill the contact openings 9. The tungsten layer 30 is formed by CVD using tungsten hexafluoride as the reactant gas. Layer 30 is then chemically/mechanically polished back to the second insulating layer 28 to form the conducting plugs 30. Continuing with FIG. 4, a metal layer 32, such as aluminum/copper (AlCu), is deposited and patterned to form the next level of electrical interconnections 32, contacting the conducting plugs 30 to complete the resistors 8 with electrical connections.

While the invention has been particularly shown and described with reference to the preferred embodiment thereof, it will be understood by those skilled in the art that various changes in form and details may be made without departing from the spirit and scope of the invention.

What is claimed is:

1. Polysilicon resistors on a semiconductor substrate comprised of:

field oxide regions on surface of said substrate surrounding and electrically isolating device areas;

a gate oxide on said device areas;

a first polysilicon layer and a refractory metal silicide layer that are patterned to form FET gate electrodes over said device areas and that form local interconnections over said field oxide that include bottom plates for capacitors;

insulating sidewall spacers and source/drain contact areas adjacent to said FET gate electrodes;

a thin first insulating layer as an interpolysilicon oxide that is used as an interelectrode dielectric layer for said capacitors;

a doped second polysilicon layer with an upper undoped third polysilicon layer patterned to form resistors and top plates for said capacitors;

a second insulating layer that electrically insulates said devices, said resistors, and said capacitors;

contact openings for said resistors in said second insulating layer and extending through said undoped third polysilicon layer to said doped second polysilicon layer;

electrically conducting plugs in said contact openings; and a patterned metal layer that forms the next level of interconnections and that contact said conducting plugs to form said resistors having said interconnections.

2. The structure of claim 1, wherein said first insulating layer is silicon oxide and has a thickness of between about 200 and 800 Angstroms.

3. The structure of claim 1, wherein said doped second polysilicon layer is doped with phosphorus to a concentration of between about 1.0 E 19 and 1.0 E 21 atoms/cm$^3$, and has a thickness of between about 500 and 1500 Angstroms.

4. The structure of claim 1, wherein said undoped third polysilicon layer has a thickness of between about 500 and 1500 Angstroms.

5. The method of claim 1, wherein said electrically conducting plugs are tungsten.

* * * * *